(12) United States Patent
Iwata et al.

(10) Patent No.: US 6,426,985 B1
(45) Date of Patent: Jul. 30, 2002

(54) VARIABLE DELAY CIRCUIT AND PHASE ADJUSTMENT CIRCUIT

(75) Inventors: Toru Iwata, Osaka; Hiroyuki Yamauchi, Takatsuki, both of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/283,888

(22) Filed: Apr. 1, 1999

(30) Foreign Application Priority Data

Apr. 3, 1998 (JP) .......................................... 10-091170

(51) Int. Cl.[7] .............................................. H04L 7/00
(52) U.S. Cl. ...................................... 375/371; 370/517
(58) Field of Search ................................ 375/371, 373, 375/375, 376; 370/516, 517, 518

(56) References Cited

U.S. PATENT DOCUMENTS 4,053,932 A * 10/1977 Yamaguti et al. ........... 348/614
5,375,470 A * 12/1994 Matsushima et al. ......... 73/626
5,515,403 A * 5/1996 Sloan et al. ................. 375/371
5,604,775 A * 2/1997 Saitoh et al. ................ 375/376
5,990,714 A * 11/1999 Tashashi ..................... 327/149

FOREIGN PATENT DOCUMENTS

JP        10276074        10/1998

* cited by examiner

Primary Examiner—Chi Pham
Assistant Examiner—Kevin M. Burd
(74) Attorney, Agent, or Firm—Renner, Otto, Boisselle & Sklar

(57) ABSTRACT

A variable delay circuit includes a plurality of delay circuits for delaying an input signal; and a selection circuit for selecting an output from one of the plurality of delay circuits in accordance with a selection signal. The plurality of delay circuits include a first delay circuit for delaying the input signal by a first delay time period and a second delay circuit for delaying the input signal by a second delay time period which is longer than the first delay time period. The difference between the first delay time period and the second delay time period is shorter than a minimum delay time period which is allowed to be set in the first delay circuit.

4 Claims, 7 Drawing Sheets

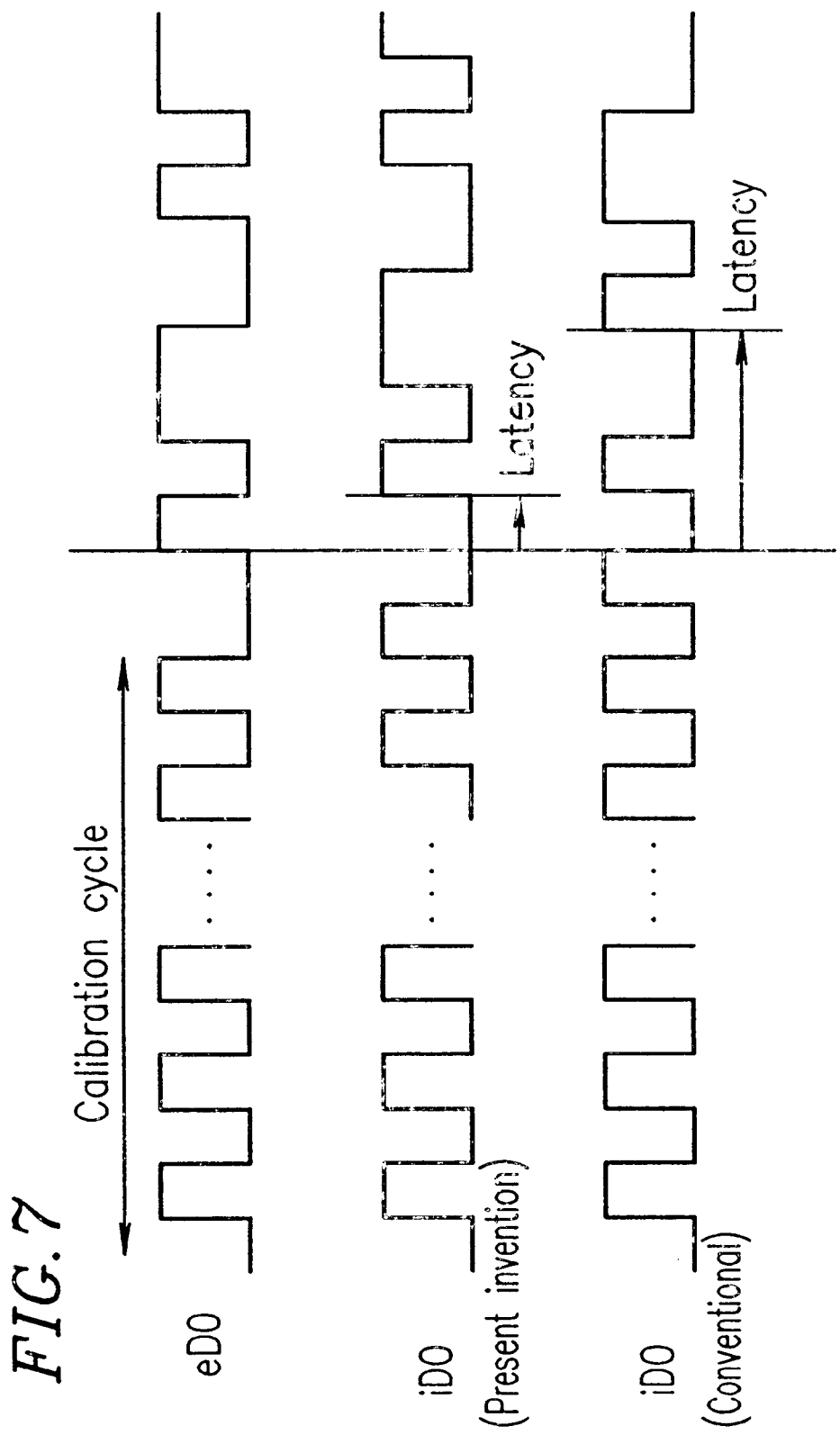

US 6,426,985 B1

VARIABLE DELAY CIRCUIT AND PHASE ADJUSTMENT CIRCUIT

BACKGROUND OF THE INVENTION

1. Field of the Invention

The present invention relates to a variable delay circuit and a phase adjustment circuit using the variable delay circuit.

2. Description of the Related Art

Data input and output is performed in synchronization with a clock signal in order to realize high speed data transfer. Especially when the frequency of the clock signal exceeds 100 MHz, an external cloak supplied from outside a semiconductor integrated circuit and an internal clock used inside the semiconductor integrated circuit need to be synchronized with each other using a PLL (Phase Locked Loop) or a DLL (Delay Locked Loop).

Digital PLL and DLL using a digital delay circuit has an advantage of being designed more easily than analog PLL and DLL, but has a disadvantage that the resolution of the phase cannot be smaller than the delay amount of one gate of the digital delay circuit.

As one solution of such a disadvantage, Japanese Laid-Open Publication No. 10-276074 discloses a method for realizing a smaller resolution time period than the delay amount of one gate of a digital delay circuit. According to this method, a resolution time period $\alpha$ is realized by combining a delay gate having a delay amount of $t_d$ and a delay gate having a delay amount of $t_d+\alpha$.

For example, delay having a delay time period in the range of $10t_d$ to $11t_d$ and a resolution time period of $0.1t_d$ can be realized by connecting $N_1$ pieces of delay gates each having a delay amount of $t_d$ and $N_2$ pieces of delay gates each having a delay amount of $1.1t_d$ in series under the condition of, for example, $N_1+N_2=10$. For example, when $N_1=7$ and $N_2=3$, a delay time period of $10.3t_d$ can be realized.

However, according to the method described in the above-mentioned publication, as the range of the delay time period which can be set enlarges, the lower limit of the range of the delay time period which can be set rises undesirably.

For example, in order to realize a delay having a resolution time period of $0.1t_d$ and a range of delay time period which can be set of $2t_d$, it is necessary to connect $N_1$ pieces of delay gates each having a delay amount of $t_d$ and $N_2$ pieces of delay gates each having a delay amount of $1.1t_d$ in series under the condition of $N_1+N_2=20$. In such a case, the lower limit of the range of delay time period which can be set is as high as $20t_d$.

The method described in the above-mentioned publication has another disadvantage in that as the resolution time period becomes more precise, the lower limit of the range of delay time period which can be set rises.

For example, in order to realize a delay having a resolution time period of $0.05t_d$, it is necessary to connect N, pieces of delay gates each having a delay amount of $t_d$ and $N_2$ pieces of delay gates each having a delay amount of $1.05t_d$ in series under the condition of $N_1+N_2=20$. In such a case, the lower limit of the range of delay time period which can be set is as high as $20t_d$.

SUMMARY OF THE INVENTION

According to one aspect of the invention, a variable delay circuit includes a plurality of delay circuits for delaying an input signal; and a selection circuit for selecting an output from one of the plurality of delay circuits in accordance with a selection signal. The plurality of delay circuits include a first delay circuit for delaying the input signal by a first delay time period and a second delay circuit for delaying the input signal by a second delay time period which is longer than the first delay time period. The difference between the first delay time period and the second delay time period is shorter than a minimum delay time period which is allowed to be set in the first delay circuit.

According to another aspect of the invention, a phase adjustment circuit includes a first variable delay circuit for delaying an input signal; a second variable delay circuit for controlling a delay time period at a higher precision than the first variable delay circuit; and a control circuit for variably controlling a delay time period of the first variable delay circuit and a delay time period of the second variable delay circuit. An output from the first variable delay circuit is delayed by the second variable delay circuit to provide an output signal having a prescribed phase relationship with respect to the input signal. The second variable delay circuit includes a plurality of delay circuits for delaying the output from the first variable delay circuit, and a selection circuit for selecting an output from one of the plurality of delay circuits in accordance with a selection signal. The plurality of delay circuits include a first delay circuit for delaying the output from the first variable delay circuit by a first delay time period and a second delay circuit for delaying the output from the first variable delay circuit by a second delay time period which is longer than the first delay time period. The difference between the first delay time period and the second delay time period is shorter than a minimum delay time period which is allowed to be set in the first delay circuit.

In one embodiment of the invention, a range of delay time period which is allowed to be set in the second variable delay circuit is greater than a resolution time period of the first variable delay circuit.

In another embodiment of the invention, a target delay time period exceeds a range of the delay time period which is allowed to be set in the second variable delay circuit, the control circuit resets the delay time period of the first variable delay circuit and resets the delay time period of the second variable delay circuit at substantially a center of the range of the delay time period which is allowed to be set in the second variable delay circuit.

According to a variable delay circuit of the present invention, an output from one of a plurality of delay circuits for delaying an input signal is selected by a selection circuit, and the selected output is provided as an output signal. The plurality of delay circuit include a first delay circuit for delaying the input signal by a first delay time period and a second delay circuit for delaying the input signal by a second delay time period which is longer than the first delay time period. The difference between the first delay time period and the second delay time period is shorter than a minimum delay time period which can be set in the first delay circuit. Thus, the range of the delay time period which can be set in the variable delay circuit it not limited to any prescribed range and can be as large as required. The lower limit of the delay time period which can be set in the variable delay circuit is fixed regardless of the range of the delay time period which can be set in the variable delay circuit.

Furthermore, a phase adjustment circuit including the above-described variable delay circuit as a second variable delay circuit is provided. Such a phase adjustment circuit outputs a signal having a prescribed phase relationship with respect to the input signal.

A range of the delay time period, which can be set in the second variable delay circuit, can be greater than a resolution time period of the first variable delay circuit. Thus, the possibility of adjusting the phase of the input signal is increased by adjusting the delay time period of the second variable delay circuit without resetting the delay time period of the first variable delay circuit. As a result, the number of times that the delay time period of the first variable delay circuit is reset can be reduced.

When the delay time period of the second variable delay circuit is reset, the delay time period of the second variable delay circuit is reset to substantially a center of the range of delay time period which can be set in the second variable delay circuit. Thus, the phase relationship between the input signal and the output signal can be adjusted at a high speed.

Thus, the invention described herein makes possible the advantages of providing a variable delay circuit for maintaining the lower limit of the range of the delay time period which can be set regardless of the range of the delay time period or the precision of the resolution time period, and a phase adjustment circuit using the variable delay circuit.

These and other advantages of the present invention will become apparent to those skilled in the art upon reading and understanding the following detailed description with reference to the accompanying figures.

BRIEF DESCRIPTION OF THE DRAWINGS

FIG. 7 show a manner in which a latency required to correct a skew is reduced by the phase adjustment circuits 400a.

DESCRIPTION OF THE PREFERRED EMBODIMENTS

Hereinafter, the present invention will be described by way of illustrative examples with reference to the accompanying drawings.

EXAMPLE 1

Figure 1:
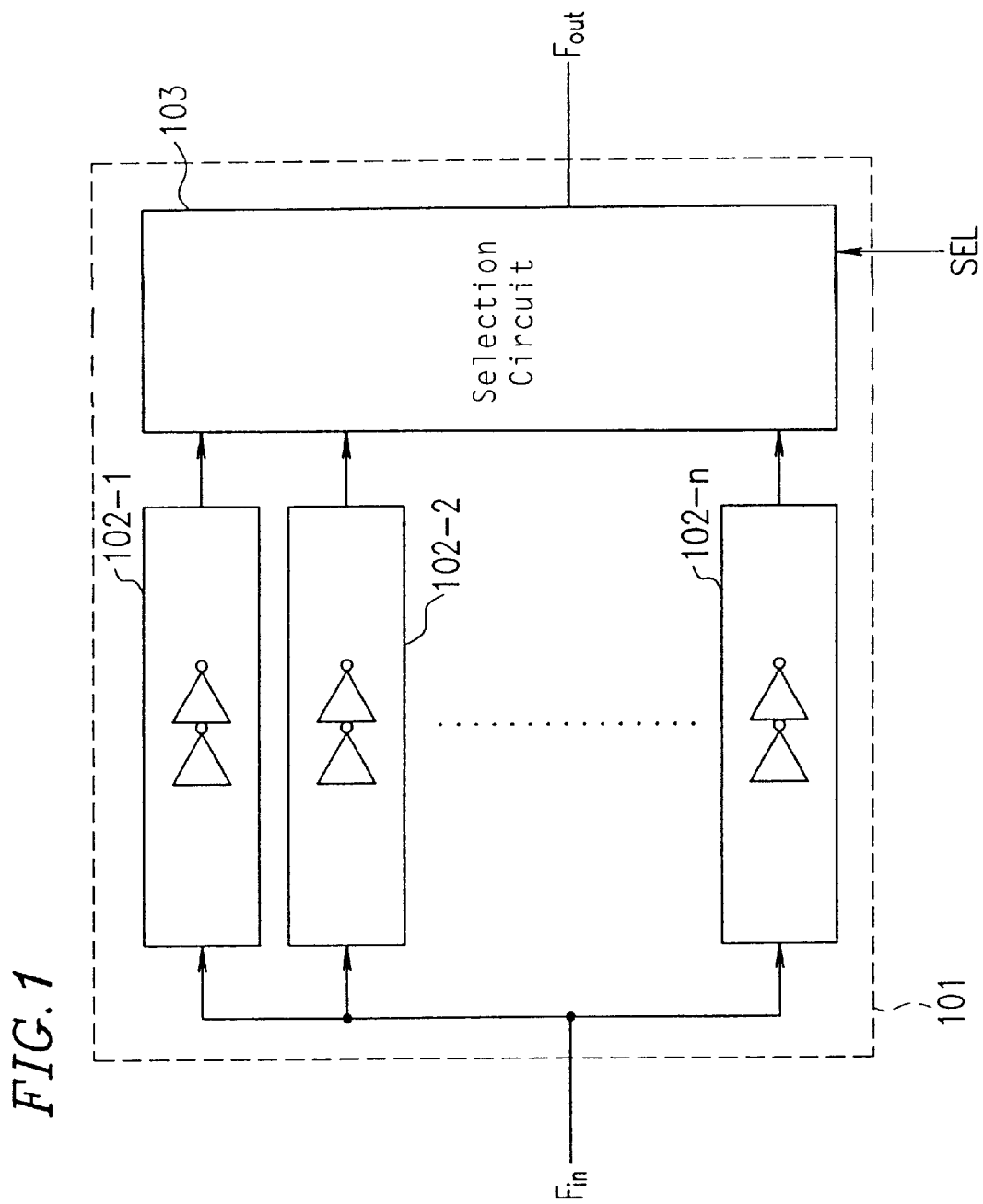
FIG. 1 shows a structure of a variable delay circuit 101 in a first example according to the present invention.

FIG. 1 shows a structure of a variable delay circuit 101 in a first example according to the present invention.

The variable delay circuit 101 includes n pieces of delay circuits 102-1 through 102-n for delaying an input signal $F_{in}$, and a selection circuit 103 for selecting an output from one of the delay circuits 102-1 through 102-n in accordance with a selection signal SEL and outputting the selected output as an output signal $F_{out}$. Herein, "n" is an arbitrary integer of 2 or more.

Each of the delay circuits 102-1 through 102-n has a fixed delay amount. Such a fixed delay amount is obtained by, for example, connecting one or more delay gates in series. The delay gates are, for example, inverters.

For example, in the case where each of the delay circuits 102-1 through 102-n includes one or more MOS transistor gates (e.g., inverters) connected in series, each of the delay circuits 102-1 through 102-n has a minimum value of the delay time period which can be set. Such a minimum value is determined depending on the process of the MOS transistor.

For example, it is assumed that the minimum value of the delay time period which can be set in the delay circuit 102-1 (i.e., minimum delay time period) is $t_d$. In this case, it is impossible to set the delay time period of less than $t_d$ in the delay circuit 102-2, but it is possible to set the delay time period of more than $t_d$ (e.g., $1.1t_d$) in the delay circuit 102-2. A longer delay time period can be set in the delay circuit 102-2 by, for example, adjusting the size and load conditions of the MOS transistor.

For example, the delay time period of the delay circuit 102-k can be set to be $\{(1+(K-1)\times 0.1\}\cdot t_d$. Herein, k=1, 2, ..., n. In this case, the difference in the delay time period between the delay circuit 102-(k+1) and the delay circuit 102-k is $0.1t_d$, which is shorter than the minimum delay time period $t_d$. The delay time period of the output signal $F_{out}$ with respect to the input signal $F_{in}$ can be variably set by selecting an output from one of the delay circuits 102-1 through 102-n each having a delay time period set therein and outputting the selected output as the output signal $F_{out}$. In other words, it is possible to set the delay time period digitally in the variable delay circuit 101 from $t_d+t_a$ by an interval of $0.1t_d$. Herein, "$t_a$" indicates a delay time period generated in the selection circuit 103.

In the case where the variable delay circuit 101 is used to set the resolution of the delay amount to $t_d$ or less in order to, for example, improve the precision of the resolution time period of the delay, the difference in the delay time period between the delay circuits 102-(k+1) and 102-k need not be precisely $0.1t_d$ as long as the difference is smaller than $t_d$. The delay time period which can be set need not be varied by a uniform interval, and intervals can include an interval of more than $0.1t_d$.

Figure 2:
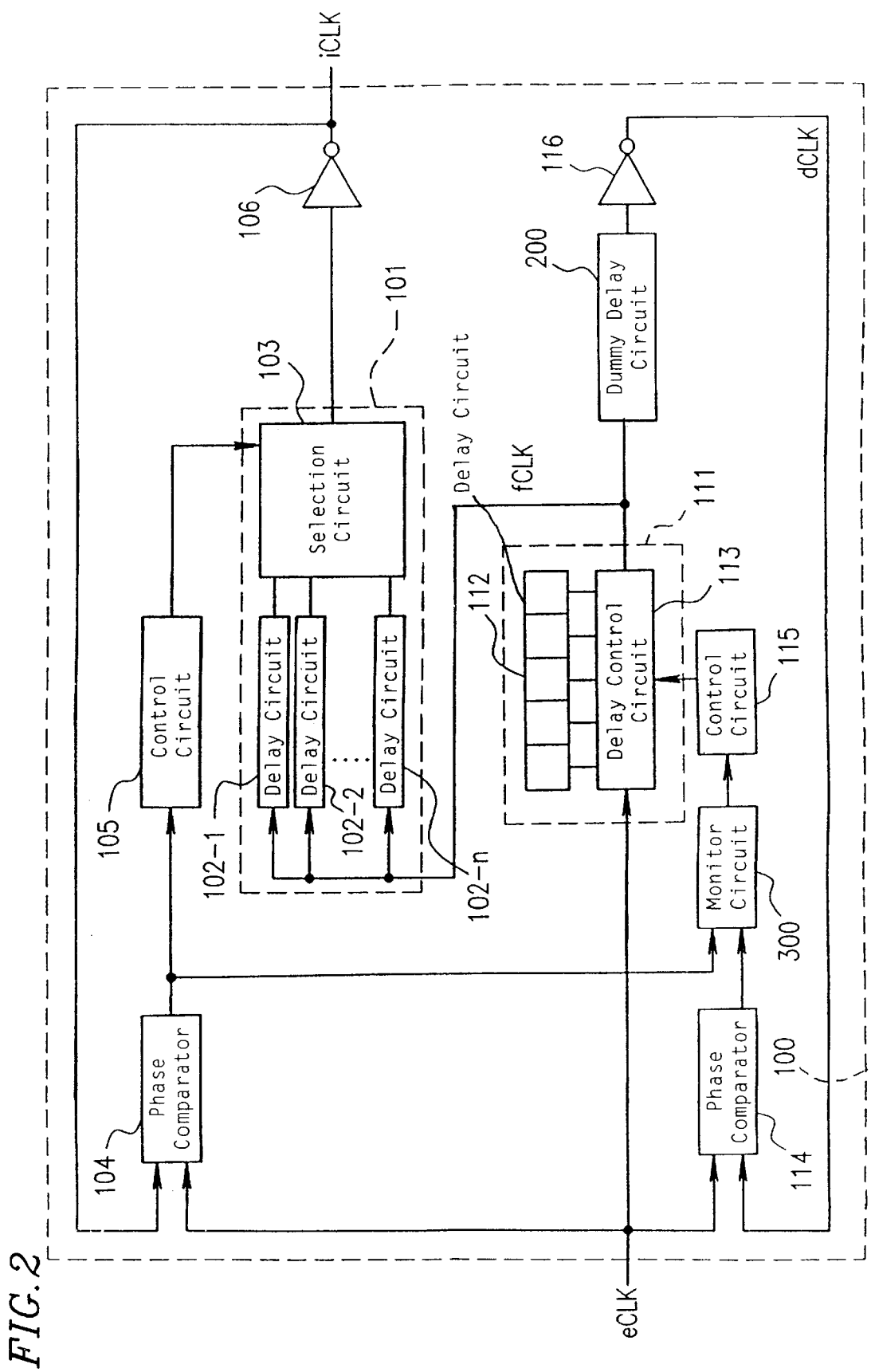
FIG. 2 shows a structure of a phase adjustment circuit 100 using the variable delay circuit 101 shown in FIG. 1.

FIG. 2 shows a structure of a phase adjustment circuit 100 including the variable delay circuit 101 shown in FIG. 1. In the phase adjustment circuit 100 shown in FIG. 2, the variable delay circuit 101 shown in FIG. 1 is used as a delay fine adjustment circuit. For convenience, the delay fine adjustment circuit is also labeled as 101.

The phase adjustment circuit 100 includes a delay rough adjustment circuit 111 for delaying an input clock signal eCLK and a delay fine adjustment circuit 101 for controlling the delay time period at a higher precision than the delay rough adjustment circuit 111. A clock signal fCLK output from the delay rough adjustment circuit 111 is delayed by the delay fine adjustment circuit 101. Thus, an output clock iCLK having a prescribed phase relationship with respect to the input clock signal eCLK is output.

The delay fine adjustment circuit 101 includes delay circuits 102-1 through 102-n, and a selection circuit 103 for selecting an output from one of the delay circuits 102-1 through 102-n in accordance with a selection signal SEL. The selection signal SEL is generated by a control circuit 105 in accordance with an output signal from a phase comparator 104. The output signal from the phase comparator 104 is obtained by comparing the phase of the input clock signal eCLK and the phase of the output clock signal iCLK.

The delay rough adjustment circuit 111 includes a delay circuit 112 and a delay control circuit 113 for controlling the delay circuit 112. The delay control circuit 113 is controlled by a control circuit 115 in accordance with an output signal from a monitor circuit 300. The monitor circuit 300 is used for monitoring the state of the delay fine adjustment circuit 101. The output signal from the monitoring circuit 300 is generated based on the output signal from the phase comparator 104 and an output signal from a phase comparator 114. The output signal from the phase comparator 114 is obtained by comparing the phase of the input clock signal eCLK and the phase of a clock signal dCLK. The clock signal dCLK is obtained by delaying the input clock signal eCLK using the delay rough adjustment circuit 111, a dummy delay circuit 200, and a dummy driver circuit 116.

The dummy driver circuit 116 is connected to an output of the delay rough adjustment circuit 111 via the dummy delay circuit 200. A delay amount of the dummy driver circuit 116 is set in advance so as to be substantially equal to the delay amount of a driver circuit 106 for driving the output clock iCLK.

It is assumed that the interval of the delay time period which can be set in the delay rough adjustment circuit 111 is $t_d$, and the range of the delay time period which can be set in the delay fine adjustment circuit 101 is from $t_d$ to $1.9t_d$. In this case, the delay time period of the phase adjustment circuit 100 can be set to be $(N+0.9)t_d$ by setting the delay time period of the delay rough adjustment circuit 111 to $(N-1)t_d$ and setting the delay time period of the delay fine adjustment circuit 101 to $1.9t_d$. The resultant state in which the delay time period of the phase adjustment circuit 100 is set to be $(N+0.9)t_d$ is referred to as state A. In this specification, the range of the delay time period which can be set is also be referred to as a "variable range".

The delay time period of the phase adjustment circuit 100 can be set to be $(N+1)t_d$ by setting the delay time period of the delay rough adjustment circuit 111 to $Nt_d$ and setting the delay time period of the delay fine adjustment circuit 101 to $t_d$. The resultant state in which the delay time period of the phase adjustment circuit 100 is set to be $(N+1)t_d$ is referred to as state B.

In the case where the delay characteristics of the delay rough adjustment circuit 111 are different from those of the delay fine adjustment circuit 101, the difference between the delay time period $(N+0.9)t_d$ in state A and the delay time period $(N+1)t_d$ in state B is larger than $0.1t_d$. In such a case, since the state of the phase adjustment circuit 100 is not locked in state A or state B, an oscillation state in which the state oscillates between state A and state B can occur. When the oscillation state occurs, the delay rough adjustment circuit 101 starts delay setting sequentially from the maximum value or the minimum value. Accordingly, the phase changes drastically.

As can be appreciated from the above description, a simple connection of the delay rough adjustment circuit 111 and the delay fine adjustment circuit 101 cannot realize a fine adjustment of the delay amount. In the phase adjustment circuit 100, the delay time period of the delay rough adjustment circuit 111 and the delay time period of the delay fine adjustment circuit 101 are independently set by allowing the phase comparators 104 and 114 to perform phase comparison independently. When the delay fine adjustment circuit 101 overflows, the delay time period of the delay rough adjustment circuit 111 is reset. Due to such a system, the above-mentioned oscillation is prevented.

The phase adjustment circuit 100 operates in, for example, the following manner.

First, the number of steps of the delay circuits 112 is controlled by the delay control circuit 113 so that the phase of the input clock signal eCLK matches the phase of the clock signal dCLK which has passed through the delay rough adjustment circuit 111, the dummy delay circuit 200 and the dummy driver circuit 116.

An example shown in FIG. 3 where the phase of the clock signal dCLK is delayed with respect to the phase of the input clock eCLK by 0.3 ns will be described. It is assumed that the resolution time period of the delay rough adjustment circuit 111 is 1 ns, the delay time period of the dummy delay circuit 200 is 2 ns, and the range of the delay time period which can be set in the delay fine adjustment circuit 101 is from 1.0 ns to 3.0 ns.

The clock signal dCLK is independent from the output clock signal iCLK. Accordingly, even when the delay circuit which is selected in the delay fine adjustment circuit 101 is changed, such a change does not influence the phase relationship between the input clock signal eCLK and the clock signal dCLK in the delay rough adjustment circuit 111. The phase of the clock signal dCLK remains delayed with respect to the input clock signal eCLK by 0.3 ns.

An output from the delay rough adjustment circuit 111 is supplied to the delay fine adjustment circuit 101 as a clock signal fCLK. An output from the delay fine adjustment circuit 101 to output as an output clock iCLK via the driver circuit 106.

Figure 3:
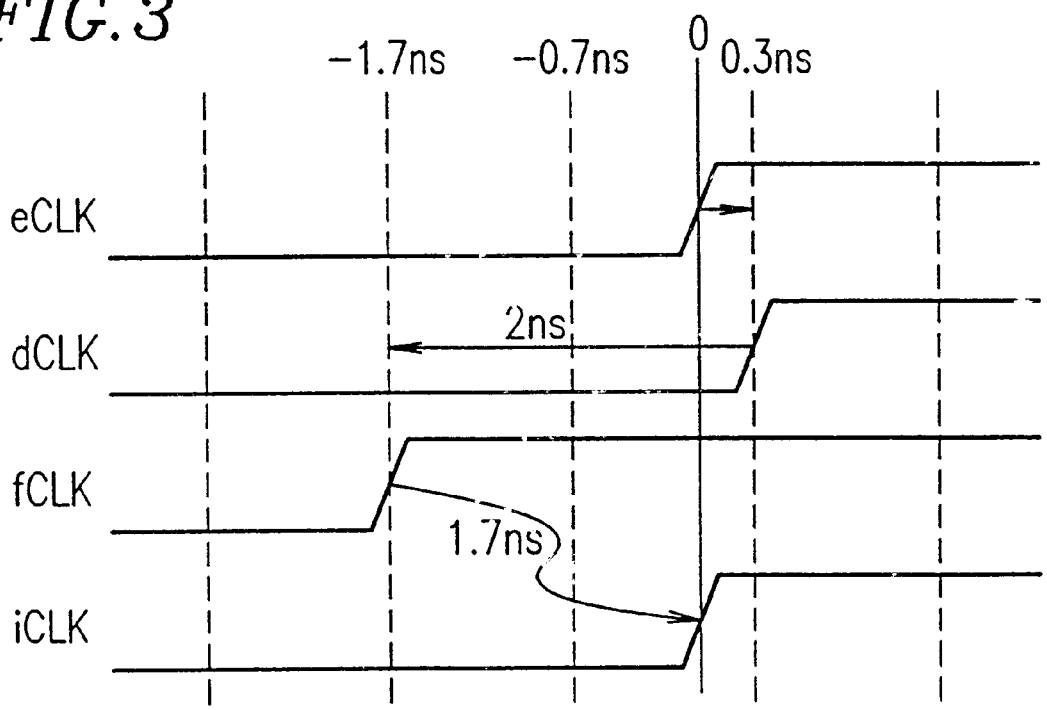
FIG. 3 is a view illustrating a relationship among clock signals.

As shown in FIG. 3, the phase of the clock signal fCLK is advanced with respect to the phase of the clock signal dCLK by 2 ns The reason for this is that the delay time period of the dummy delay circuit 200 is set to be 2 ns.

It is appreciated that the phase of the output clock signal iCLK and the phase of the input clock signal eCLK can be matched to each other by delaying the phase of the clock signal fCLK by 1.7 ns as shown in FIG. 3.

The delay fine adjustment circuit 101 has a range of the delay time period which can be set from 1.0 ns to 3.0 ns by an interval of 0.1 ns. Accordingly, the phase of the output clock signal iCLK and the phase of the input clock signal eCLK can be matched to each other by setting the delay time period of the delay fine adjustment circuit 101 to 1.7 ns.

As described above, the monitor circuit 300 monitors the state of the delay fine adjustment circuit 101. When the range of the delay time period which can be set in the delay fine adjustment circuit 101 is greater than the resolution time period of the delay rough adjustment circuit 111, the possibility of adjusting the phase by adjusting the delay time period of the delay fine adjustment circuit 101 without resetting the delay time period of the delay rough adjustment circuit 111 is raised. The reason for this is that even when the phase difference between the input clock signal eCLK and the clock signal dCLK is detected, the phase difference may be conveniently adjusted by the delay fine adjustment circuit 101. As can be appreciated, the oscillation operation by which the phase oscillates drastically, can be prevented by adjusting the delay time period of the delay fine adjustment circuit 101 without resetting the delay time period of the delay rough adjustment circuit 111. Furthermore, the number of times of resetting the delay time period of the delay rough adjustment circuit 111 is decreased.

Figure 4A:
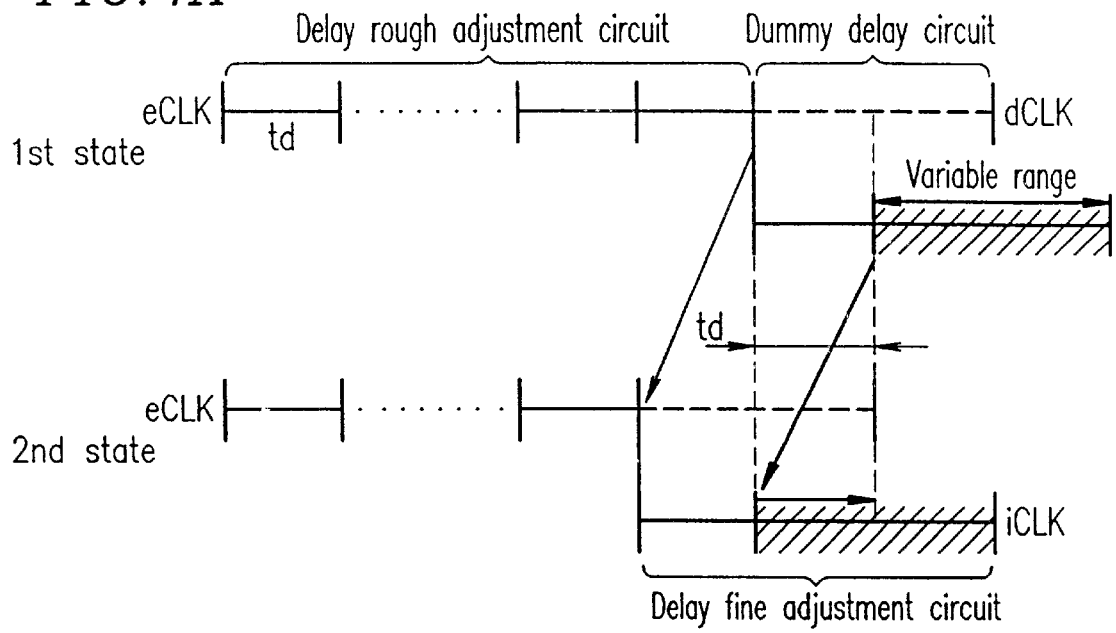
FIGS. 4A and 4B show different states of a delay rough adjustment circuit 111 and a delay fine adjustment circuit 101.

FIG. 4A shows the states of the delay rough adjustment circuit 111 and the delay fine adjustment circuit 101 when the range of the delay time period which can be set in the delay fine adjustment circuit 101 is greater than the resolution time period of the delay rough adjustment circuit 111.

Herein, the resolution time period of the delay rough adjustment circuit 111 is $t_d$. A state where the delay time period of the delay rough adjustment circuit 111 is set to be $Nt_d$ and the delay time period of the delay fine adjustment circuit 101 is set to be the lower limit of the variable range (e.g., $t_d$) is referred to as a "first state". When it is required to reduce the delay time period of the phase adjustment circuit 100 from the first state, the range of the delay time period which can be adjusted by the phase adjustment circuit 100 is exceeded. In this case, the delay time period of the delay rough adjustment circuit 111 is reset to be $(N-1)t_d$, and the delay time period of the delay fine adjustment circuit 101 is also reset in accordance therewith. The delay time period which is set in the delay fine adjustment circuit 101 gradually increases from the lower limit of the variable range and is stabilized at a prescribed delay time period. Such a stable state obtained after the delay time period of the delay rough adjustment circuit 111 and the delay time period of the delay fine adjustment circuit 101 is referred to as a "second state".

Once a transition from the first state to the second state is performed, even when it is required to change the delay time period of the phase adjustment circuit 100, the change can be compensated for by adjusting the delay time period of the delay fine adjustment circuit 101 without performing a transition from the second state to the first state, as long as the amount of the change is sufficiently small. In this case, it is not necessary to reset the delay time period of the delay rough adjustment circuit 111. Thus, an unstable operation of performing the first state to the second state and immediately back to the first state does not occur.

Figure 4B:
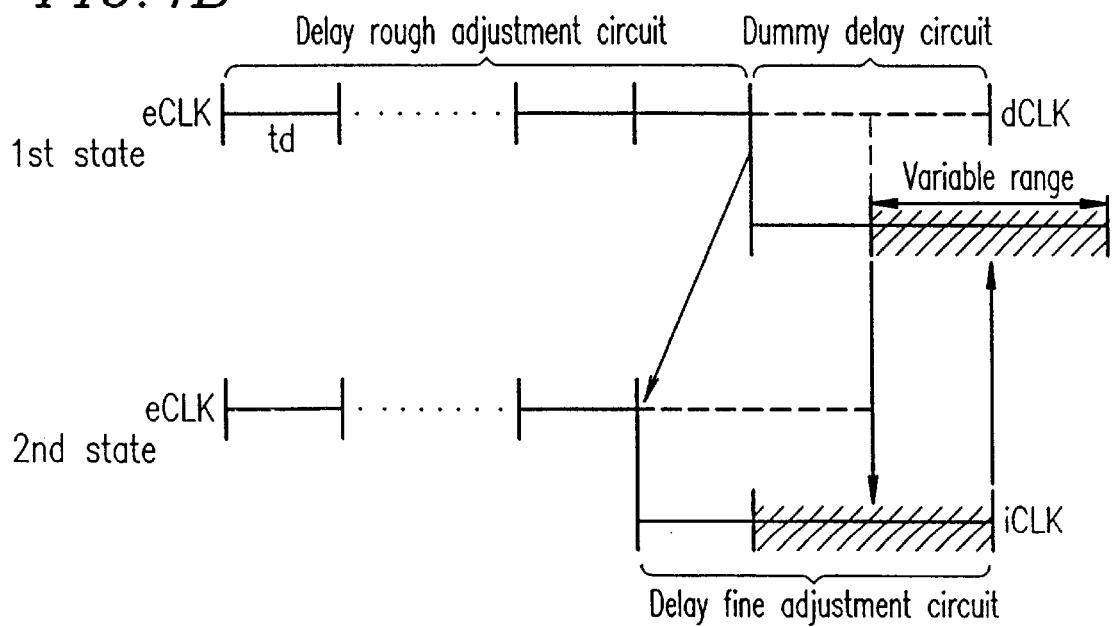

When a transition from the first state to the second state or a transition from the second state to the first state occurs, the number of times that the phase comparator 104 performs phase comparison can be reduced by resetting the delay fine adjustment circuit 101. For example, when a transition from the first state to the second state occurs, the delay time period of the delay fine adjustment circuit 101 is set at substantially a center of the range of the delay time period which can be set in the delay fine adjustment circuit 101 as shown in FIG. 4B. The delay time period in the phase adjustment circuit 100 is not varied when a transition from the first state to the second state occurs due to the resetting of the delay time period of the delay fine adjustment circuit 101. Thus, the output clock signal iCLK can quickly follow the input clock signal eCLK. As a result, the phase relationship between the input clock signal eCLK and the output clock signal iCLK can be adjusted at a high speed.

When the variable range of the delay time period of the delay fine adjustment circuit 101 is set larger, the delay fine adjustment circuit 101 is unlikely to overflow. Thus, the resetting of the delay time period of the delay rough adjustment circuit 111 is unlikely to occur. As a result, the number of times that the delay time period of the delay rough adjustment circuit 111 is required to reset can be further reduced.

In the first example, matching of the phase of the input clock signal eCLK and the phase of the output clock signal iCLK is described. The present invention is not limited the adjustment of the clock signals. The phase adjustment circuit 100 can operate to provide an output signal having a prescribed relationship to any input signal.

EXAMPLE 2

Figure 5:
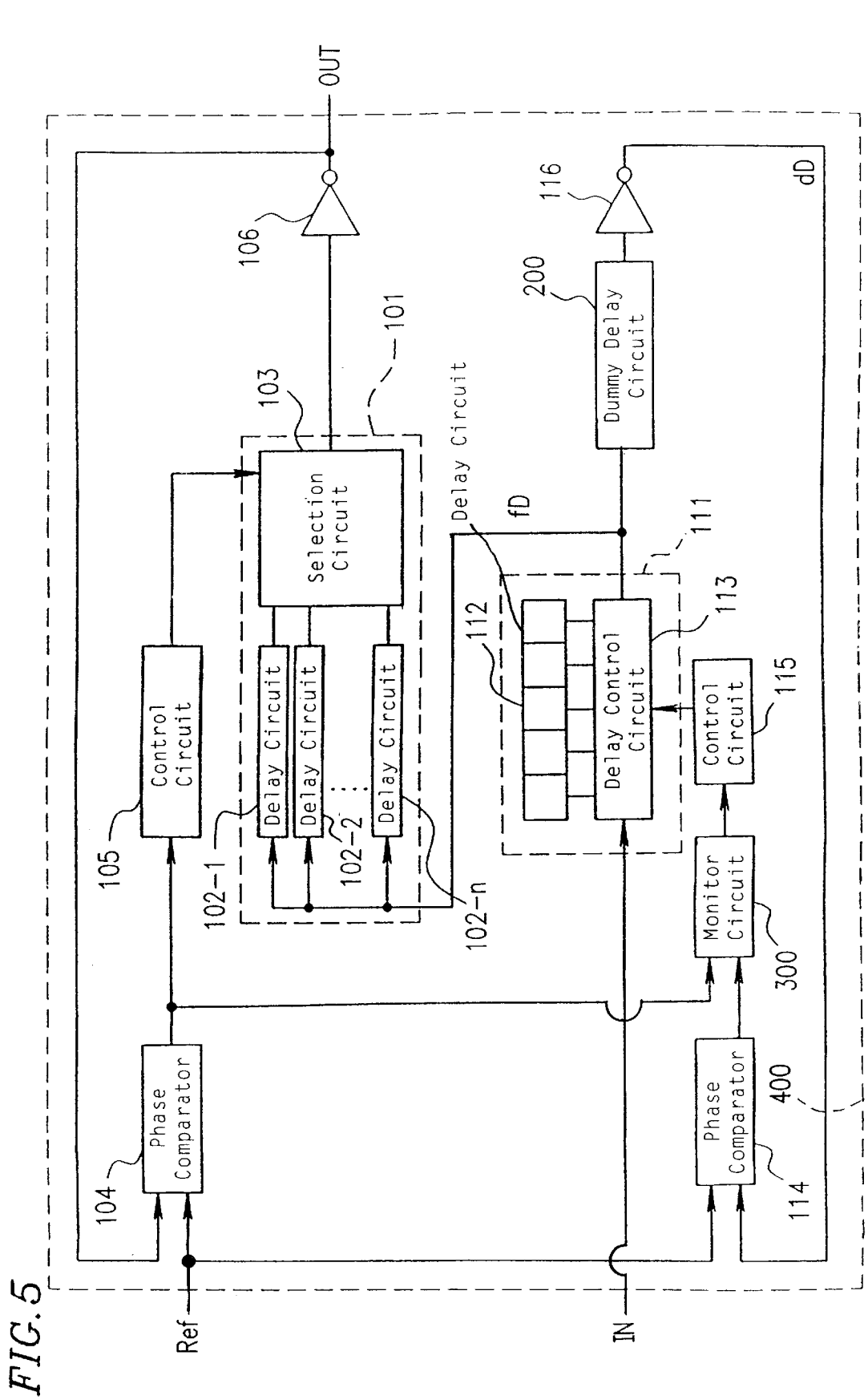
FIG. 5 shows a structure of a phase adjustment circuit 400 in a second example according to the present invention.

FIG. 5 shows a structure of a phase adjustment circuit 400 in a second example according to the present invention. Identical elements previously discussed with respect to FIG. 2 bear identical reference numerals and the descriptions thereof will be omitted.

A reference signal Ref is input to the phase adjustment circuit 400. The phase comparator 104 compares the phase of the reference signal Ref and the phase of the output signal OUT, and outputs a signal indicating the comparison result. The phase comparator 114 compares the phase of the reference signal Ref and the phase of a signal dD, and outputs a signal indicating the comparison result.

Figure 6:
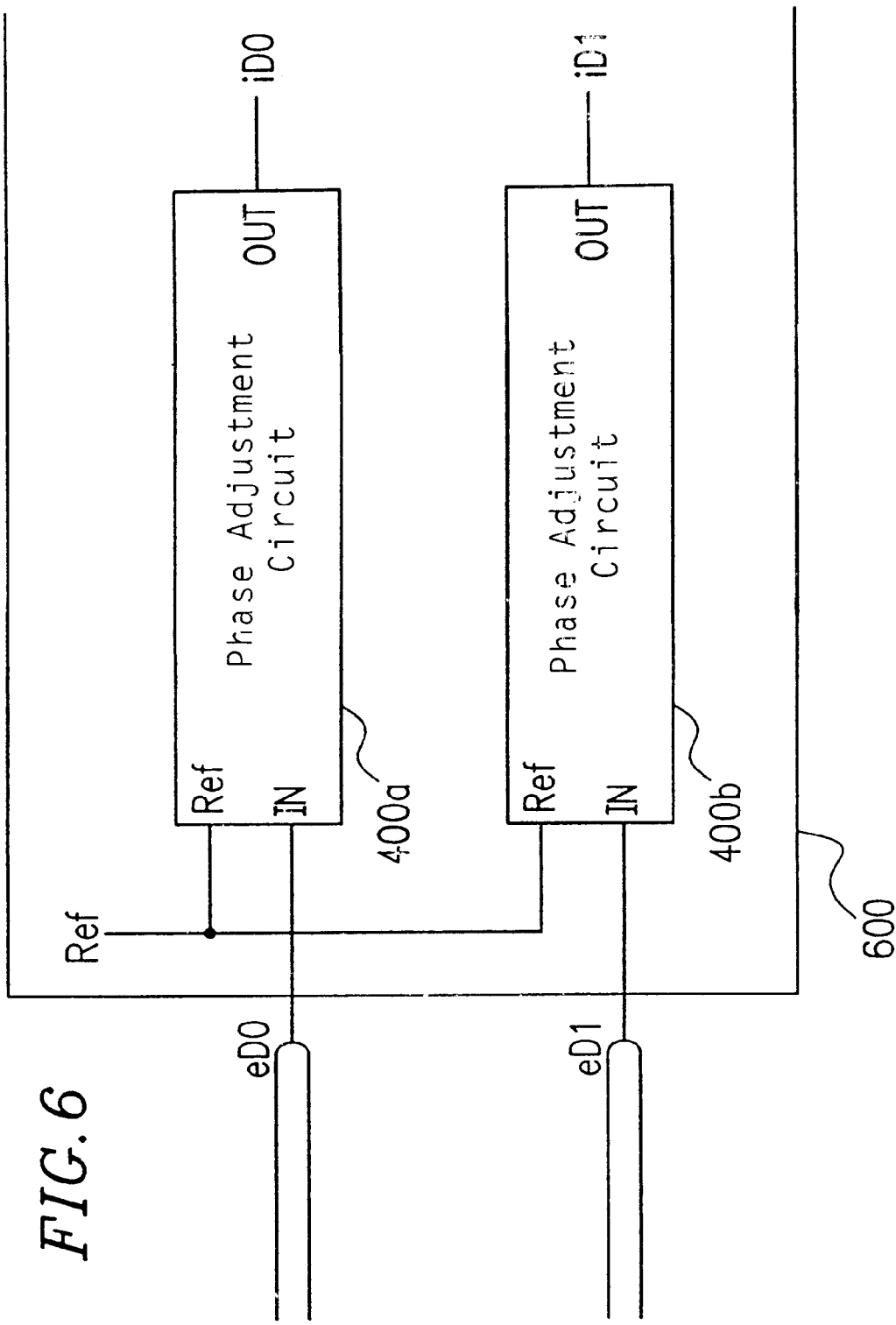
FIG. 6 shows a structure of a semiconductor integrated circuit including phase adjustment circuits 400a and 400b.

FIG. 6 shows a structure of a semiconductor integrated circuit 600 including phase adjustment circuits 400a and 400b. The phase adjustment circuits 400a and 400b have an identical structure to that of the phase adjustment circuits 400.

Input data eD0 supplied from outside the semiconductor integrated circuit 600 is input to the phase adjustment circuit 400a. Input data eD1 supplied from outside the semiconductor integrated circuit 600 is input to the phase adjustment circuit 400b.

A shape-oriented skew can occur between the input data eD0 and eD1. Such a shape-oriented skew is generated by, for example, the difference in the length of the transfer path such as cables or connectors, or the difference in the load of the transfer path. When the data transfer speed is low, such a skew can be ignored without presenting any problem. However, when the data transfer speed is high, correction of such a skew is required. The phase adjustment circuits 400a and 400b shown in FIG. 6 are used for correcting the skew generated between the input data eD0 and eD1.

A change in the potential of the input data eD0 and eD1 does not occur at a constant rate. Accordingly, a calibration cycle by which the potential of the input data eD0 and eD1 change periodically is provided before transferring the actual data. In the calibration cycle, the delay time period of the delay rough adjustment circuit 111 and the delay time period of the delay fine adjustment circuit 101 are set in the phase adjustment circuit 400a with respect to the input date eD0. The delay time period of the delay rough adjustment circuit 111 and the delay time period of the delay fine adjustment circuit 101 are set also in the phase adjustment circuit 400b with respect to the input date eD1. Thus, the shape-oriented skew which does not change overtime is corrected.

Use of the phase adjustment circuits 400a and 400b reduces the latency required to correct the skew compared to the method described in Japanese Laid-Open Publication No. 10-276074

FIG. 7 shows a manner in which the latency required to correct a skew is reduced by the phase adjustment circuit 400a.

In the phase adjustment circuit 400a, the minimum value of the delay time period which can be set in the delay fine adjustment circuit 101 is $(t_d+t_s)$. Herein, "$t_d$" indicates the minimum value of the delay time period which can be set in the delay circuits 102, and "$t_s$" indicates the delay time generated in the selection circuit 103 Where the minimum value of the delay time period which can be set in the delay rough adjustment circuit 111 is Os and the delay time period caused by the driver circuit 106 is $t_r$, the time difference between the input data eD0 and the output data iD0 is $(t_d+t_s+t_r)$. Where $t_d$=200 ps and $t_s$=$t_r$=100 ps, when the data rate is 2.5 Gbps or less, the latency generated to correct the skew is 1 cycle.

In the case of the delay fine adjustment circuit described in Japanese Laid-Open Publication No. 10-276074, when the resolution time period is set to be $0.1t_d$, the minimum value of the delay time period which can be set in the delay fine adjustment circuit is $10t_d$. As a result, the time difference between the input data eD0 and the output data iD0 is $(10t_d+t_s+t_r)$. When the data rate is 2.5 Mbps, the latency generated to correct the skew is as great as 6 cycles. The upper limit of the data rate at which the skew can be corrected within the range of the latency of 1 cycle is 450 Mbps. As can be appreciated from this description, the delay fine adjustment circuit described in the above-mentioned publication cannot deal with a super-high speed, low latency data transfer.

According to the present invention, a variable delay circuit for maintaining the lower limit of the range of the delay time period which can be set regardless of the range of the delay time period or the precision of the resolution time period with a high precision at a low latency is provided. Moreover, a phase adjustment circuit for matching phases with a high precision at a low latency is provided.

Various other modifications will be apparent to and can be readily made by those skilled in the art without departing from the scope and spirit of this invention. Accordingly, It is not intended that the scope of the claims appended hereto be limited to the description as set forth herein, but rather that the claims be broadly construed.

What is claimed is:

1. A variable delay circuit, comprising:

a plurality of delay circuits for delaying an input signal; and a selection circuit for selecting an output from one of the plurality of delay circuits in accordance with a selection signal, wherein:

the plurality of delay circuits include a first delay circuit for delaying the input signal by a first delay time period and a second delay circuit for delaying the input signal by a second delay time period which is longer than the first delay time period, and the difference between the first delay time period and the second delay time period is shorter than a minimum delay time period which is allowed to be set in the first delay circuit.

2. A phase adjustment circuit, comprising:

a first variable delay circuit for delaying an input signal;

a second variable delay circuit for controlling a delay time period at a higher precision than the first variable delay circuit; and a control circuit for variably controlling a delay time period of the first variable delay circuit and a delay time period of the second variable delay circuit, wherein:

an output from the first variable delay circuit is delayed by the second variable delay circuit to provide an output signal having a prescribed phase relationship with respect to the input signal, the second variable delay circuit includes a plurality of delay circuits for delaying the output from the first variable delay circuit, and a selection circuit for selecting an output from one of the plurality of delay circuits in accordance with a selection signal, the plurality of delay circuits include a first delay circuit for delaying the output from the first variable delay circuit by a first delay time period and a second delay circuit for delaying the output from the first variable delay circuit by a second delay time period which is longer than the first delay time period, and the difference between the first delay time period and the second delay time period is shorter than a minimum delay time period which is allowed to be set in the first delay circuit.

3. A phase adjustment circuit according to claim 2, wherein a range of delay time period which is allowed to be set in the second variable delay circuit is greater than a resolution time period of the first variable delay circuit.

4. A phase adjustment circuit according to claim 2, wherein, when a target delay time period exceeds a range of the delay time period which is allowed to be set in the second variable delay circuit, the control circuit resets the delay time period of the first variable delay circuit and resets the delay time period of the second variable delay circuit at substantially a center of the range of the delay time period which is allowed to be set in the second variable delay circuit.

* * * * *